(12) United States Patent
Basin et al.

(10) Patent No.: US 10,229,130 B2
(45) Date of Patent: *Mar. 12, 2019

(54) SYSTEMS AND METHODS FOR MANIPULATING AND MANAGING COMPUTER ARCHIVE FILES

(71) Applicant: PKWARE, Inc., Milwaukee, WI (US)

(72) Inventors: Yuri Basin, Thiensville, WI (US);
Michael J Beirne, Chicago, IL (US);
James C Peterson, Menomonee Falls, WI (US); Karen L Peterson, Menomonee Falls, WI (US)

(73) Assignee: PKWARE, Inc., Milwaukee, WI (US)

(*) Notice: Subject to any disclaimer, the term of this patent is extended or adjusted under 35 U.S.C. 154(b) by 0 days.

This patent is subject to a terminal disclaimer.

(21) Appl. No.: 15/854,488

(22) Filed: Dec. 26, 2017

(65) Prior Publication Data

US 2018/0121460 A1   May 3, 2018

Related U.S. Application Data

(63) Continuation of application No. 13/005,245, filed on Jan. 12, 2011, now Pat. No. 9,886,444, which is a
(Continued)

(51) Int. Cl.
*G06F 17/00* (2006.01)
*G06F 17/30* (2006.01)
(Continued)

(52) U.S. Cl.
CPC ........ *G06F 17/30153* (2013.01); *H03M 7/30* (2013.01); *H04L 67/16* (2013.01);
(Continued)

(58) Field of Classification Search
CPC .................................................. G06F 21/6227
See application file for complete search history.

(56) References Cited

U.S. PATENT DOCUMENTS 4,041,284 A    8/1977 Bond
4,156,922 A    5/1979 Majerski et al.
(Continued)

FOREIGN PATENT DOCUMENTS

JP      9-223052       8/1997
WO      WO 99/49391    9/1999

OTHER PUBLICATIONS

PKWARE, "Appnote.txt," Version 1.0 (1990).
(Continued)

*Primary Examiner* — Eliyah S. Harper
(74) *Attorney, Agent, or Firm* — Barich IP Law Group

(57) ABSTRACT

A computer program for managing and manipulating archive zip files of a computer. The program includes a system and method for opening, creating, and modifying, and extracting zip archive files. The program is fully integrated into Microsoft Windows Explorer and is accessed via Explorer menus, toolbars, and/or drag and drop operations. An important feature of the program is the archive manager which may be used to open a zip file, create a new zip file, extract zip files, modify zip files, etc. The program is integrated into Microsoft Windows Explorer using the shell name space extension application program interface developed by Microsoft.

10 Claims, 13 Drawing Sheets

Related U.S. Application Data continuation of application No. 11/586,866, filed on Oct. 26, 2006, now Pat. No. 7,890,465, which is a continuation of application No. 10/970,897, filed on Oct. 21, 2004, now abandoned, which is a continuation of application No. 09/803,355, filed on Mar. 9, 2001, now Pat. No. 6,879,988.

(60) Provisional application No. 60/187,969, filed on Mar. 9, 2000.

(51) Int. Cl.
　　　H03M 7/30　　　(2006.01)
　　　H04L 29/08　　　(2006.01)
　　　G06F 11/14　　　(2006.01)

(52) U.S. Cl.
　　　CPC ........ *H04L 69/329* (2013.01); *G06F 11/1451* (2013.01); *Y10S 707/99931* (2013.01); *Y10S 707/99942* (2013.01); *Y10S 707/99943* (2013.01); *Y10S 707/99953* (2013.01)

(56) References Cited

U.S. PATENT DOCUMENTS

| | | |
|---|---|---|
| 4,179,746 A | 12/1979 | Tubbs |
| 4,377,846 A | 3/1983 | Yoshida |
| 4,521,866 A | 6/1985 | Petit et al. |
| 4,542,453 A | 9/1985 | Patrick et al. |
| 4,792,954 A | 12/1988 | Arps et al. |
| 4,862,167 A | 8/1989 | Copeland |
| 4,891,643 A | 1/1990 | Mitchell et al. |
| 4,905,297 A | 2/1990 | Langdon, Jr. et al. |
| 4,933,883 A | 6/1990 | Pennebaker et al. |
| 4,935,882 A | 6/1990 | Pennebaker et al. |
| 4,939,639 A | 7/1990 | Lee et al. |
| 4,947,318 A | 8/1990 | Mineo |
| 4,989,000 A | 1/1991 | Chevion et al. |
| 5,003,307 A | 3/1991 | Whiting et al. |
| 5,016,009 A | 5/1991 | Whiting et al. |
| 5,025,258 A | 6/1991 | Duttweiler |
| 5,051,745 A | 9/1991 | Katz |
| 5,091,955 A | 2/1992 | Iseda et al. |
| 5,099,440 A | 3/1992 | Pennebaker et al. |
| 5,126,739 A | 6/1992 | Whiting et al. |
| 5,142,283 A | 8/1992 | Chevion et al. |
| 5,146,221 A | 9/1992 | Whiting et al. |
| 5,150,209 A | 9/1992 | Baker et al. |
| 5,155,847 A | 10/1992 | Kirouac et al. |
| 5,159,336 A | 10/1992 | Rabin et al. |
| 5,179,555 A | 1/1993 | Videlock et al. |
| 5,218,700 A | 6/1993 | Beechick |
| 5,270,712 A | 12/1993 | Iyer et al. |
| 5,272,478 A | 12/1993 | Allen |
| 5,274,805 A | 12/1993 | Ferguson et al. |
| 5,298,896 A | 3/1994 | Lei et al. |
| 5,315,655 A | 5/1994 | Chaplin |
| 5,363,099 A | 11/1994 | Allen |
| 5,404,315 A | 4/1995 | Nakano et al. |
| 5,414,425 A | 5/1995 | Whiting et al. |
| 5,440,504 A | 8/1995 | Ishikawa et al. |
| 5,446,895 A | 8/1995 | White et al. |
| 5,455,946 A | 10/1995 | Mohan |
| 5,463,390 A | 10/1995 | Whiting et al. |
| 5,463,772 A | 10/1995 | Thompson et al. |
| 5,465,224 A | 11/1995 | Guttag et al. |
| 5,469,564 A | 11/1995 | Junya |
| 5,475,388 A | 12/1995 | Gormish et al. |
| 5,481,713 A | 1/1996 | Wetmore et al. |
| 5,485,411 A | 1/1996 | Guttag et al. |
| 5,493,524 A | 2/1996 | Guttag et al. |
| 5,506,580 A | 4/1996 | Whiting et al. |
| 5,517,439 A | 5/1996 | Suzuki et al. |
| 5,532,694 A | 7/1996 | Mayers et al. |
| 5,535,300 A | 7/1996 | Hall, II et al. |
| 5,546,080 A | 8/1996 | Langdon, Jr. et al. |
| 5,563,595 A | 10/1996 | Strohacker |
| 5,581,697 A | 12/1996 | Gramlich et al. |
| 5,587,710 A | 12/1996 | Choo et al. |
| 5,590,350 A | 12/1996 | Guttag et al. |
| 5,592,162 A | 1/1997 | Printz et al. |
| 5,594,674 A | 1/1997 | Printz et al. |
| 5,596,763 A | 1/1997 | Guttag et al. |
| 5,600,847 A | 2/1997 | Guttag et al. |
| 5,623,546 A | 4/1997 | Hardy et al. |
| 5,627,995 A | 5/1997 | Miller et al. |
| 5,634,065 A | 5/1997 | Guttag et al. |
| 5,640,578 A | 6/1997 | Balmer et al. |
| 5,654,702 A | 8/1997 | Ran |
| 5,659,616 A | 8/1997 | Sudia |
| 5,671,389 A | 9/1997 | Saliba |
| 5,675,645 A | 10/1997 | Schwartz et al. |
| 5,682,152 A | 10/1997 | Wang et al. |
| 5,689,452 A | 11/1997 | Cameron |
| 5,694,128 A | 12/1997 | Kim |
| 5,696,954 A | 12/1997 | Guttag et al. |
| 5,699,275 A | 12/1997 | Beasley et al. |
| 5,715,470 A | 2/1998 | Asano et al. |
| 5,732,214 A | 3/1998 | Subrahmanyam |
| 5,734,119 A | 3/1998 | France et al. |
| 5,734,880 A | 3/1998 | Guttag et al. |
| 5,737,345 A | 4/1998 | Pelz et al. |
| 5,745,756 A | 4/1998 | Henley |
| 5,771,355 A | 6/1998 | Kuzma |
| 5,774,081 A | 6/1998 | Cheng et al. |
| 5,778,374 A | 7/1998 | Whiting et al. |
| 5,781,901 A | 7/1998 | Kuzma |
| 5,802,520 A | 9/1998 | Jerkunica et al. |
| 5,802,549 A | 9/1998 | Goyal et al. |
| 5,805,913 A | 9/1998 | Guttag et al. |
| 5,808,572 A | 9/1998 | Yang et al. |
| 5,813,011 A | 9/1998 | Yoshida et al. |
| 5,818,369 A | 10/1998 | Withers |
| 5,828,848 A | 10/1998 | Maccormack et al. |
| 5,832,273 A | 11/1998 | Mizuse |
| 5,832,520 A | 11/1998 | Miller |
| 5,838,996 A | 11/1998 | deCarmo |
| 5,841,865 A | 11/1998 | Sudia |
| 5,844,575 A | 12/1998 | Reid |
| 5,847,980 A | 12/1998 | Okamoto et al. |
| 5,854,597 A | 12/1998 | Murashita et al. |
| 5,857,035 A | 1/1999 | Rust |
| 5,867,600 A | 2/1999 | Hongu |
| 5,881,225 A | 3/1999 | Worth |
| 5,903,723 A | 5/1999 | Beck et al. |
| 5,907,703 A | 5/1999 | Kronenberg et al. |
| 5,909,638 A | 6/1999 | Allen |
| 5,911,776 A | 6/1999 | Guck |
| 5,912,636 A | 6/1999 | Gormish et al. |
| 5,918,002 A | 6/1999 | Klemets et al. |
| 5,933,503 A | 8/1999 | Schell et al. |
| 5,937,188 A | 8/1999 | Freeman |
| 5,940,507 A | 8/1999 | Cane et al. |
| 5,956,733 A | 9/1999 | Nakano et al. |
| 5,960,117 A | 9/1999 | Hiratani |
| 5,926,208 A | 10/1999 | Hasebe |
| 5,961,635 A | 10/1999 | Guttag et al. |
| 5,970,097 A | 10/1999 | Ishiwaka et al. |
| 5,974,539 A | 10/1999 | Guttag et al. |
| 5,986,594 A | 11/1999 | Nakayama et al. |
| 5,995,747 A | 11/1999 | Guttag et al. |
| 5,995,748 A | 11/1999 | Guttag et al. |
| 6,018,747 A | 1/2000 | Burns et al. |
| 6,021,198 A | 2/2000 | Anigbogu et al. |
| 6,023,506 A | 2/2000 | Ote et al. |
| 6,028,541 A | 2/2000 | Levine |
| 6,032,200 A | 2/2000 | Lin |
| 6,041,147 A | 3/2000 | Mead |
| 6,043,763 A | 3/2000 | Levine |
| 6,047,318 A | 4/2000 | Becker et al. |
| 6,049,630 A | 4/2000 | Wang et al. |
| 6,049,671 A | 4/2000 | Slivka et al. |
| 6,052,531 A | 4/2000 | Waldin et al. |
| 6,061,732 A | 5/2000 | Korst et al. |

(56) References Cited

U.S. PATENT DOCUMENTS

| | | |
|---|---|---|
| 6,078,921 A | 6/2000 | Kelley |
| 6,083,279 A | 7/2000 | Cuomo et al. |
| 6,088,717 A | 7/2000 | Reed et al. |
| 6,091,777 A | 7/2000 | Guetz et al. |
| 6,094,453 A | 7/2000 | Gosselin et al. |
| 6,098,163 A | 8/2000 | Guttag et al. |
| 6,112,211 A | 8/2000 | Bradshaw et al. |
| 6,116,768 A | 9/2000 | Guttag et al. |
| 6,118,392 A | 9/2000 | Levine |
| 6,121,904 A | 9/2000 | Levine |
| 6,122,378 A * | 9/2000 | Yoshiura ............ G11B 20/00007 380/217 |
| 6,125,348 A | 9/2000 | Levine |
| 6,144,320 A | 11/2000 | Van Der Vleuten |
| 6,145,069 A | 11/2000 | Dye |
| 6,148,340 A | 11/2000 | Bittinger |
| 6,151,609 A | 11/2000 | Truong |
| 6,154,771 A | 11/2000 | Rangan et al. |
| 6,157,706 A | 12/2000 | Rachelson |
| 6,161,218 A | 12/2000 | Taylor |
| 6,161,219 A | 12/2000 | Ramkumar et al. |
| 6,166,664 A | 12/2000 | Acharya |
| 6,167,453 A | 12/2000 | Becker et al. |
| 6,173,317 B1 | 1/2001 | Chaddha et al. |
| 6,173,394 B1 | 1/2001 | Guttag et al. |
| 6,182,045 B1 | 1/2001 | Kredo et al. |
| 6,185,681 B1 | 2/2001 | Zizzi |
| 6,188,334 B1 | 2/2001 | Bengio et al. |
| 6,195,026 B1 | 2/2001 | Acharya |
| 6,198,412 B1 | 3/2001 | Goyal |
| 6,217,234 B1 | 4/2001 | Dewar et al. |
| 6,225,925 B1 | 5/2001 | Bengio et al. |
| 6,229,463 B1 | 5/2001 | Van Der Vleuten et al. |
| 6,233,017 B1 | 5/2001 | Chaddha |
| 6,233,565 B1 | 5/2001 | Lewis et al. |
| 6,236,341 B1 | 5/2001 | Dorward et al. |
| 6,275,848 B1 | 8/2001 | Arnold |
| 6,289,509 B1 | 9/2001 | Kryloff |
| 6,324,525 B1 | 11/2001 | Kramer et al. |
| 6,345,288 B1 | 2/2002 | Reed et al. |
| 6,356,937 B1 | 3/2002 | Montville et al. |
| 6,363,363 B1 | 3/2002 | Haller et al. |
| 6,363,486 B1 | 3/2002 | Knapton, III |
| 6,366,930 B1 | 4/2002 | Parker et al. |
| 6,373,950 B1 | 4/2002 | Rowney |
| 6,378,054 B1 | 4/2002 | Karasudani et al. |
| 6,381,742 B2 | 4/2002 | Forbes et al. |
| 6,401,241 B1 | 6/2002 | Taylor |
| 6,405,265 B1 | 6/2002 | Kronenberg et al. |
| 6,415,435 B1 | 7/2002 | Mcintyre |
| 6,427,149 B1 * | 7/2002 | Rodriguez ........ G06F 17/30076 707/693 |
| 6,434,561 B1 | 8/2002 | Durst et al. |
| 6,456,985 B1 | 9/2002 | Ohtsuka |
| 6,460,044 B1 | 10/2002 | Wang |
| 6,466,999 B1 | 10/2002 | Sliger et al. |
| 6,477,703 B1 | 11/2002 | Smith et al. |
| 6,484,259 B1 | 11/2002 | Barlow |
| 6,487,278 B1 | 11/2002 | Skladman et al. |
| 6,498,835 B1 | 12/2002 | Skladman et al. |
| 6,522,268 B2 | 2/2003 | Belu |
| 6,526,574 B1 | 2/2003 | Jones |
| 6,539,396 B1 | 3/2003 | Bowman-Amuah |
| 6,546,417 B1 | 4/2003 | Baker |
| 6,529,908 B1 | 5/2003 | Piett et al. |
| 6,567,793 B1 * | 5/2003 | Hicks ................ G06F 21/10 380/279 |
| 6,577,311 B1 * | 6/2003 | Crosby ............. G06F 17/30905 345/428 |
| 6,577,735 B1 | 6/2003 | Bharat |
| 6,594,822 B1 | 7/2003 | Schweitz et al. |
| 6,604,106 B1 | 8/2003 | Bodin et al. |
| 6,615,350 B1 | 9/2003 | Schell et al. |
| 6,629,150 B1 * | 9/2003 | Huded ................ G06F 21/64 707/999.004 |
| 6,635,088 B1 | 10/2003 | Hind et al. |
| 6,657,702 B1 | 12/2003 | Chui et al. |
| 6,684,331 B1 | 1/2004 | Srivastava |
| 6,742,176 B1 | 5/2004 | Million et al. |
| 6,760,845 B1 | 7/2004 | Cafarelli et al. |
| 6,785,677 B1 | 8/2004 | Fritchman |
| 6,785,810 B1 | 8/2004 | Lirov et al. |
| 6,807,632 B1 * | 10/2004 | Carpentier ............ H04L 67/108 380/28 |
| 6,850,248 B1 * | 2/2005 | Crosby ............. G06F 17/30905 345/428 |
| 6,870,547 B1 * | 3/2005 | Crosby ............. G06F 17/30905 345/600 |
| 6,879,988 B2 * | 4/2005 | Basin ................ G06F 17/30153 |
| 6,883,032 B1 | 4/2005 | Dempski |
| 6,892,382 B1 | 5/2005 | Hapner et al. |
| 6,904,110 B2 | 6/2005 | Trans et al. |
| 6,914,985 B1 | 7/2005 | Shrader et al. |
| 6,934,836 B2 | 8/2005 | Strand et al. |
| 6,952,823 B2 * | 10/2005 | Kryloff ................ G06F 8/658 717/170 |
| 6,959,300 B1 | 10/2005 | Caldwell et al. |
| 6,976,165 B1 | 12/2005 | Carpentier et al. |
| 6,981,141 B1 | 12/2005 | Mahne et al. |
| 6,983,371 B1 | 1/2006 | Hurtado et al. |
| 6,996,251 B2 | 2/2006 | Malone et al. |
| 7,069,271 B1 * | 6/2006 | Fadel ................ G06Q 10/00 705/26.62 |
| 7,085,850 B2 | 8/2006 | Calvignac et al. |
| 7,127,712 B1 | 10/2006 | Noble et al. |
| 7,133,846 B1 | 11/2006 | Ginter et al. |
| 7,136,882 B2 | 11/2006 | Collins et al. |
| 7,139,811 B2 | 11/2006 | Lev Ran et al. |
| 7,139,918 B2 | 11/2006 | Chang et al. |
| 7,149,896 B1 | 12/2006 | Bahl et al. |
| 7,184,573 B2 | 2/2007 | Malone et al. |
| 7,298,851 B1 | 11/2007 | Hendricks et al. |
| 7,386,726 B2 | 6/2008 | Gehrmann et al. |
| 7,434,052 B1 | 10/2008 | Rump |
| 2001/0002485 A1 | 5/2001 | Bisbee et al. |
| 2001/0014884 A1 | 8/2001 | Dillard et al. |
| 2001/0023360 A1 | 9/2001 | Nelson et al. |
| 2001/0029530 A1 | 10/2001 | Naito et al. |
| 2001/0030667 A1 | 10/2001 | Kelts |
| 2001/0037309 A1 | 11/2001 | Vrain |
| 2001/0042121 A1 | 11/2001 | Defosse et al. |
| 2001/0055407 A1 | 12/2001 | Rhoads |
| 2002/0007287 A1 | 1/2002 | Straube et al. |
| 2002/0029227 A1 | 3/2002 | Multer et al. |
| 2002/0029228 A1 * | 3/2002 | Rodriguez ........ G06F 17/30076 |
| 2002/0040369 A1 | 4/2002 | Multer et al. |
| 2002/0042833 A1 | 4/2002 | Hendler et al. |
| 2002/0049717 A1 | 4/2002 | Routtenberg et al. |
| 2002/0059144 A1 | 5/2002 | Meffert et al. |
| 2002/0076052 A1 | 6/2002 | Yung et al. |
| 2002/0078466 A1 | 6/2002 | Beyda |
| 2002/0120639 A1 * | 8/2002 | Basin ................ G06F 17/30153 |
| 2002/0178439 A1 | 11/2002 | Rich et al. |
| 2002/0184509 A1 | 12/2002 | Scheidt et al. |
| 2002/0188605 A1 | 12/2002 | Adya et al. |
| 2003/0016770 A1 | 1/2003 | Trans et al. |
| 2003/0034905 A1 | 2/2003 | Anton et al. |
| 2003/0046572 A1 | 3/2003 | Newman et al. |
| 2003/0065873 A1 | 4/2003 | Collins et al. |
| 2003/0115169 A1 | 6/2003 | Ye |
| 2003/0144858 A1 | 7/2003 | Jain et al. |
| 2003/0233494 A1 | 12/2003 | Ghosh et al. |
| 2004/0030898 A1 | 2/2004 | Tsuria et al. |
| 2004/0098715 A1 | 5/2004 | Aghera |
| 2004/0107125 A1 | 6/2004 | Guheen et al. |
| 2004/0117845 A1 | 6/2004 | Karaoguz |
| 2005/0055357 A1 | 3/2005 | Campbell |
| 2005/0060356 A1 | 3/2005 | Saika |
| 2005/0097077 A1 | 5/2005 | Bolosky et al. |
| 2005/0147946 A1 | 7/2005 | Ramamurthy et al. |
| 2005/0188058 A1 | 8/2005 | Inoue |
| 2005/0251686 A1 | 11/2005 | Torrubia-Saez |

(56) References Cited

U.S. PATENT DOCUMENTS

| | | |
|---|---|---|
| 2006/0143199 A1 | 6/2006 | Peterson et al. |
| 2006/0143691 A1 | 6/2006 | Peterson et al. |
| 2006/0155731 A1 | 7/2006 | Peterson et al. |
| 2006/0173985 A1 | 8/2006 | Moore |
| 2006/0200253 A1 | 9/2006 | Hoffberg et al. |
| 2006/0200761 A1 | 9/2006 | Judd et al. |
| 2006/0253451 A1 | 11/2006 | Van De Sluis et al. |
| 2006/0265330 A1 | 11/2006 | Fukasawa |
| 2006/0265760 A1 | 11/2006 | Daemke et al. |

OTHER PUBLICATIONS

PKWARE, "Appnote.txt," Version 2.0.
PKWARE, "Appnote.txt," Version 4.5 (Nov. 1, 2001).
PKWARE, "Appnote.txt," Version 6.2.1 (Apr. 1, 2005).
PKWARE, "Appnote.txt," Version 6.2.2 (Jan. 6, 2006).
PKWARE, "Appnote.txt," Version 6.3.2 (Sep. 28, 2007).
PKWARE, "Appnote.txt," Version 5.2 (Jun. 2, 2003).
Appnote.txt, PKWARE, Jul. 1998.
AES Encryption Information, WinZip Computing, May 15, 2013.
Bray N: "How Digital Certificates Work", Computers & Security, Elsevier Science Publishers, Amsterdam, NL, vol. 16, No. 1, 1997, p. 62, XP004063818, ISSN: 0167-4048.
Campbell D: "Extending the Windows Explorer with Name Space Extensions", Microsoft Systems Journal, Microsoft Corp., Redmond, WA, US, vol. 5, No. 6, Jul. 1996, pp. 89-96, XP000874429, ISSN: 0889-9932.
Cevenini G et al: "A Multiprovider, Universal, E-Mail Service for the Secure Exchange of Legally-Binding Multimedia Documents," Conference Proceedings Article, 2000, pp. 47-50, XP 010515038.
"Chilkat Encryption .NET Component—RSA /AES," Jul. 12, 2003, Retrieved from the Internet on Jan. 17, 2007: URL: <http:l/web.archive.org/web/20030712162512/http://www.visual-mp3.com/review/4017. html>.
CuteZIP InfoGuide, p. 1.
Denning, "Cryptography and Data Security," 1982, Addison-Wesley, pp. 92-98.
Desmond, "PKWare Offers Encryption for .ZIP Files," Jul. 16, 2002, Retrieved from the Internet on Sep. 30, 2006: URL: <http://www.esecurityplanet.com/prodser/article.php/10753 1408191>.
"GlobalSCAPE Releases CuteZIP 1.0, the Next-Generation ZIP Utility, Combining Music and File Compress," GlobalSCAPE, Mar. 2000, Retrieved from the Internet on Mar. 31, 2007, URL: <http://www.cuteftp.com/company/press.aspx?id=20>.
Green M., Top Ten File Compression Tools, Mar. 12, 1999, http://pcworld.com.
John Leyden: "Zip File Encryption Compromise Thrashed Out", Internet Article, Online!, Jan. 21, 2004, XP002296118, http://www.theregister.co.uk/2004/01/21/zip file encryption compromise thrashed/.
Mark Nelson, Dr. Dobbs Journal: "LZW Data Compression," Internet Article, Online!, Oct. 1989, XP002296120, http://www.dogma.neUmarkn/articles/lzw/lzw.htm.
Menezes et al., "Handbook of Applied Cryptography," 1997, CRC Press, pp. 506-515.
Menezes et al., "Handbook of Applied Cryptography," 1997, CRC Press, pp. 555-566.
Nelson, "Data Compression with the Burrows Wheeler Transform," Jul. 2001, Retrieved from the Internet on Jan. 23, 2007: URL: <http://www.ddj.com/184409957>.
PalmHandZipper by HandWatch, Inc., Handango—Admin Product Detail, retrieved from the Internet on Jul. 1, 2008, URL: <http://www.handango.com/AdminProductDetailView.jsp?siteId= 1 &productId=23214&platform Id=1 &productType=2>.
PKCS # 7: Cryptographic Message Syntax Standard, RSA Laboratories, 1993, Retrieved from the Internet on Jul. 6, 2008: <URL: ftp://ftp.rsasecurity.com/pub/pkcs/ps/pkcs-7.ps>.
PKWARE, "Appnote.txt" 1998 Version, Jul. 1998, Retrieved from the Internet on Jan. 5, 2009: <URL: http://http://mediasrv.ns. ac.yu/extra/fileformat/archive/zip/zip.txt>.

PKWARE, "X.509 Digital Certificates and the .ZIP File Archive," Retrieved from the Internet on Jan. 5, 2009: <URL: http://mycroft.com .au/clients/mycroft. nsf/downloadlookup/pkzx509. pdf/$File/pkzx509. pdf?Open Element>.
PKWARE: "Appnote.txt—.zip file format specification", Internet Article, Online!, Jan. 11, 2001, XP002296121, http://www.the7soft.com/file-formats/file-formats-Archivers/zi p45.zip.
"PlexCrypt 4.2 User Manual," Jun. 2003, Retrieved from the Internet on Jan. 17, 2007: URL: <http://www.plexobject.com/software/plexcrypUdocs/plexcrypt. pdf>.
"PlexCrypt Compression-Encryption 3.1 details," Aug. 2001, Retrieved from the Internet on Jan. 17, 2007: URL: <http://www.downloadsofts.com/download/Security-Privacy/Encryption-Tools/PlexCrypt-Com pression-Encryptio n-download-detai 1s.html>.
"PlexCrypt Compression-Encryption 3.1," Aug. 2001, Retrieved from the Internet on Jan. 17, 2007: URL: <http://www.fivesign.com/downloads/program/PlexCrypt-CompressionEncryption 6715 66.html>.
"PlexCrypt Compression-Encryption," Aug. 2001, Retrieved from the Internet on Jan. 17, 2007: URL: <http://www.exefind.com/plexcrypt-compression-encryption-P13552.html>.
Press Release PKWARE, Inc.: "PKWARE Releases New ZIP Format Specification", Internet Article, Online!, Dec. 2001, XP002296119, URL:http://www.pkware.com/news/releases/2001/120501. php.
Randal C Burns: "Differential Compression: A Generalized Solution for Binary Files", Thesis, Dec. 1996, XP002211282.
Reichenberg ER C: "Delta Storage for Arbitrary Non-Text Files", 1991, New York, NY, US, pp. 144-152, XP008030925, ISBN: 0-89791-429-5.
Roth et al., "Access Control and Key Management for Mobile Agents," Elsevier Science Ltd., 1998.
Schneier et al., "Twofish :A 128-Bit Block Cipher," Abstract, Jun. 1998, Retrieved from the Internet on Mar. 31, 2007, URL: <http://www.schneier.com/paper-twofish-paper.html>.
Schneier, "Applied Cryptography," 1996, John Wiley & Sons, 2nd Edition, pp. 270-278.
Schneier, "Applied Cryptography," 1996, John Wiley & Sons, 2nd Edition, pp. 336-339.
Schneier, "Applied Cryptography," 1996, John Wiley & Sons, 2d Edition, pp. 523-525.
SecuriSys, "SafenSigned makes Software Distributed over the Net Safe and Sound," Shareware Press Release, Retrieved from the Internet on Mar. 3, 2004: URL: <http://www. dpdirectory.com/prsecuri. htm.
Sems, "The Short Version—Compression Software Saves You Time & Money," Feb. 2002, Smart Computing, Retrieved from the Internet on Sep. 30, 2006: URL: <http://www.smartcomputing.com/editorial/ article.asp?article=articles/2002/s 1302/04s02/ 04s02. asp&articleid=11585&guid.
Smartphone & Pocket PC Magazine, URL: <http://www.pocketpcmag.com/_archives/mar03/zayo.asp>, Mar. 2003, vol. 6, No. 1.
Spector, "Updated WinZip Alters Zip Format," May 30, 2003, PC World, Retrieved from the Internet on Sep. 30, 2006: URL: ttp://www.pcworld.com/article/id, 110820-page, 1/article.html>.
Stallings, W., Cryptography and Network Security: Principles and Practice, 1999, Prentice Hall, 2nd Edition, pp. 164-206 and 356-398.
Tip et al., "Practical Experience with an Application Extractor for JAVA," Oct. 1999, ACM, p. 292-305.
Web Site Information: http://203.162.7.85/unescocourse/computervision/101.htm#10.ImageCompression, 10.1 Introduction to image compression, pp. 1-2.
Web Site Information: http://corsoft.com/aileron.asp, Palm Email with attachments, Corsoft, pp. 1-2.
Web Site Information: http://cuteftp.com/cutezip/features.asp, GlobalSCAPE—CuteZIP, CuteZIP 2.1 Features, pp. 1-2.
Web Site Information: http://cuteftp.com/cutezip/tour_ 1.asp, GlobalSCAPE—CuteZIP, Product Feature Tour: CuteZIP, pp. 1-7.
Web Site Information: http://dogma.net/DataCompression/ArithmeticCoding.shtml, The Data Compression Library—Arithmetic Coding, pp. 1-4.

(56) References Cited

OTHER PUBLICATIONS

Web Site Information: http://reviews.cnet.com/4505-3514_7-204 71822-2.html?legacy=cent&tag=dir, Globalscape CuteZip 2.1—Full review—Browsers—CNET Reviews, pp. 1-3.
Web Site Information: http://www.cc.gatech.edu/-kingd/comp_links.html, Data Compression and Information Theory Links, pp. 1-2.
Web Site Information: http://www.cs.duke.edu/-jsv/Papers/catalog/node63.html#HoV:ACsurvey, External Memory Algorithms, I/O Efficiency, pp. 1-2.
Web Site Information: http://www.cuteftp.com/cutezip/, GlobalSCAPE—CuteZIP—Compression Software, p. 1.
Web Site Information: http://www.dpdirectory.com/prescuri.htm, Shareware Press Release, pp. 1-4.
Web Site Information: http://www.hn.is.uec.ac.jp/-arimura/compression_links.html, Mitsuharu Arimura's Bookmarks on Source Coding/Data Compression, pp. 1-12.
Web Site Information: http://www.noisette-software.com/products/pocketpc/CrunchIt/, CrunchIt for Microsoft Pocket PC, pp. 1-3.
Web Site Information: http://www.plexobject.com/software/plexcrypt, PlexObject Solutions, Inc., pp. 1-2.
Web Site Information: http://www.pocketsoft.com/oem/overview.html, Pocket Soft, Inc.—RTPatch OEM, pp. 1-3.
Web Site Information: http://www.pocketsoft.com/products.html, Pocket Soft, Inc.—Products Page, pp. 1-2.
Web Site Information: http://www.pocketsoft.com/products.html, RTPatch Professional Products, pp. 1-4.
Web Site Information: http://www.pocketsoft.com/unix/overview.html, Pocket Soft, Inc.—RTPatch for UNIX, pp. 1-2.
Web Site Information: http://www.pocketsoft.com/vxworks/overview.html, Pocket Soft, Inc.—RTPatch for VxWorks, pp. 1-2.
Web Site Information: http://www.pocketsoft.com/wince/overview.html, Pocket Soft, Inc.—RTPatch for CE, pp. 1-2.
Web Site Information: http://www.pocketsoft.com/windows/overview.html, Pocket Soft, Inc.—RTPatch for Windows, pp. 1-2.
Web Site Information: http://www.resco.net/pocketpc/explorer/default.asp, Resco Explorer 2005 for Pocket PC, pp. 1-2.
Web Site Information: http://home.worldnet.fr/mounierr/HomePage.html, Welcome to Arjfolder Official Site, pp. 1-2.
Web Site Information: http://www.cleverness.com/cleverzip/browse/explorer.html, CleverZip—Explorer View, p. 1.
Web Site Information: http://www.creative.net/-acco/, AECO Systems Presents . . . Zip Explorer Pro v2.54, p. 1.
Web Site Information: http://www.knoware.com/in32docs/index.html, Internet Neighborhood FTP Client—The Premier FTP Namespace Extension for Windows, pp. 1-2.
Web Site Information: http://www.knoware.com/in32docs/screenshots.html, Internet Neighborhood—the premier FTP Namespace Extension, KnoWare, Inc., Award-Winning Internet Utilities, pp. 1-3.
Web Site Information: http://www.mijeniz.com/zipmagic2000.asp, ZipMagic 2000—Take the Hassle out of Zip files!, Mijenix Corporation, pp. 1-2.
Web Site Information: http://www.mijeniz.com/zm2000primer.asp, ZipMagic 2000 Compression Primer, Mijenix Corporation, pp. 1-2.
Web Site Information: http://www.netexplore.de/english/features.htm, Features, FTP in a New Generation, pp. 1-2.

Web Site Information: http://www.netzip.com/products/Info_Netzip_Win.html, Netzip—Award Winning Zip File, Download, and File Viewing Utilities, Netzip 5 Top Internet Programs, pp. 1-3.
Web Site Information: http://www1.sprintpcs.com/media/Assets/Equipment/Handsets/pdf/samsungspi600.pdf, Sprint PCS VisionSM Smart Device SP-i600 by Samsung® User's Guide, pp. 1-182.
Web Site Information: Feldspar, "An Explanation of the DEFLATE Algorithm," Aug. 23, 1997, http://www.gzip.org/deflate.html, accessed on Jan. 20, 2010.
WinAce 2.6.5, Nov. 30, 1999, E-Merge, http://winace.com.
"Winzip" Announcement Nico Mak Computing, XX, XX, 1995, pp. 1-106, XP002908148.
Winzip Computing, Inc.: "AES Encryption Information", Internet Article, Online!, May 15, 2003, XP002296117, http://web.archive.org/web/20030618094654/http://www.winzip.com/aes info.htm.
Ziv J et al: "A Universal Algorithm for Sequential Data Compression", IEEE Transactions on Information Theory, IEEE Inc. New York, US, vol. 23, No. 3, 1977, pp. 337-343, XP002911734, ISSN: 0018-9448.
Ziv J et al: "Compression of Individual Sequences Via Variable-Rate Coding", IEEE Transactions on Information Theory, IEEE Inc. New York, US, vol. IT-24, No. 5, Sep. 1978, pp. 530-536, XP000565213.
PKWARE Appnote—Sep. 29, 2006.
PKWARE, "PKZIP® 6.0 for Windows Getting Started Manual" (Jan. 28, 2003).
PKWARE, "Appnote.txt," Version 5.2.1 (Oct. 6, 2003).
PKWARE, "Appnote.txt," Version 5.2.4 (Jan. 12, 2004).
PKWARE, "Appnote.txt," Version 6.2.0 (Apr. 26, 2004).
Notice of Acceptance for Australia Patent Application No. 23208 / Serial No. 785475; filed Nov. 3, 2002.
European Search Report for Application No. EP 02 25 1648; dated Mar. 25, 2004.
Examination Report for European Application No. 02 251 648.8-1225; dated Apr. 8, 2005.
Summons to attend oral proceedings for European Application No. 02 251 648.8-1225; dated Apr. 27, 2007.
Decision to refuse European Application No. 02 251 648.8-1225; dated Sep. 17, 2007.
U.S. Appl. No. 10/970,897, abandoned.
U.S. Appl. No. 11/586,869, abandoned.
U.S. Appl. No. 11/586,891, abandoned.
U.S. Appl. No. 11/586,868, abandoned.
U.S. Appl. No. 11/588,006, abandoned.
U.S. Appl. No. 11/588,007, abandoned.
U.S. Appl. No. 11/588,005, abandoned.
U.S. Appl. No. 11/586,834, abandoned.
U.S. Appl. No. 11/588,003, abandoned.
U.S. Appl. No. 11/586,867, abandoned.
U.S. Appl. No. 11/358,865, abandoned.
U.S. Appl. No. 11/358,534, abandoned.
U.S. Appl. No. 11/358,497, abandoned.
U.S. Appl. No. 11/358,505, abandoned.
U.S. Appl. No. 11/358,745, abandoned.
U.S. Appl. No. 11/358,002, abandoned.

* cited by examiner

108

| Item (Menu): | Description: |
|---|---|
| Test (File) | Test the contents of the .ZIP file. |
| Extract (File) | Extract file(s) via the Extract dialog. |
| Add (File) | Add file(s) via the Extract dialog. |
| Save (File) | Save the contents of the .ZIP file. |
| Save As (File) | Save the contents of the .ZIP file to another file and open that file in PKZIP Explorer. |
| Save Copy As (File) | Save the contents of the .ZIP file to another file but remain in the current PKZIP Explorer window. |
| Columns (View) | Specify which information columns (e.g. CRC32) you want PKZIP Explorer to display in the right pane. |
| Show Log (View) | Invoke the Log dialog. |
| PKZIP Options (View) | Invoke the Options/Properties tab dialog where you may specify several PKZIP Explorer configuration parameters. |

FIG. 6B

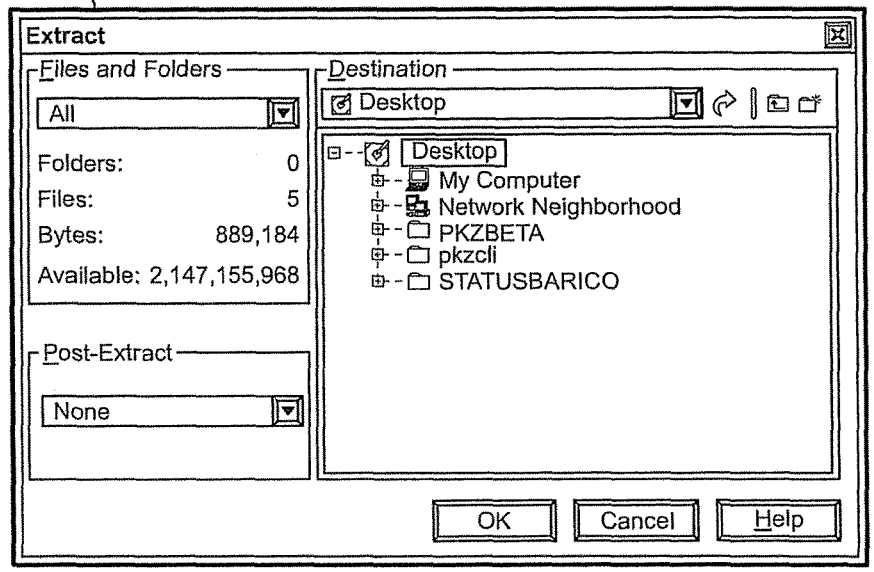

FIG. 7

SYSTEMS AND METHODS FOR MANIPULATING AND MANAGING COMPUTER ARCHIVE FILES

RELATED APPLICATIONS

This application is a continuation of U.S. patent application Ser. No. 13/005,245, filed Jan. 12, 2011, which is a continuation of U.S. patent application Ser. No. 11/586,866, filed on Oct. 26, 2006, now U.S. Pat. No. 7,890,465, which is a continuation of U.S. patent application Ser. No. 10/970,897, filed on Oct. 21, 2004, which is a continuation of U.S. patent application Ser. No. 09/803,355, filed on Mar. 9, 2001, now U.S. Pat. No. 6,879,988, which claims the benefit of U.S. Provisional Patent Application No. 60/187,969, filed Mar. 9, 2000.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The present invention relates to managing and manipulating computer archive files, and more particularly to a system and method for managing and manipulating zip files through a computer program integrated into Microsoft Windows Explorer.

Compression of computer files has been around for years. Compressing files can save tremendous amounts of disk space, and transfer time when downloading files from the Internet or transferring files through email. These days, almost any file one downloads from the Internet is compressed in some way. A standard compressed file or folder as it is sometimes called contains one or more files that were compressed into a single file or folder. A lot of different compression formats have been developed over the years. The zip format, created by the assignee of the present invention, is the most common compressed file format for the personal computer, but there are many others in use today. Any file with a ".zip" extension is most likely a compressed file in the zip format. Zipping a file means compressing the file into the zip format archive so that it occupies less disk space, and unzipping a file means uncompressing a compressed file in the zip format. A zip file is a file which has been compressed with PKZIP®, from PKWare, Inc., or another compatible archiver. Zip files are indicated by a ".zip" filename extension.

A computer file is compressed through the use of one or more compression algorithms. A compression algorithm is essentially a mathematical formula that scans the data in the file for compressible information. For example, compressible information may be any repeating pattern or string that can be represented once. The compression algorithm will then represent the repeated patterns in a coded manner to save space. For standard compression, most of the compression algorithms work basically the same way. Some are just more efficient or faster than others.

Generally, the contents of a compressed file cannot be accessed unless the archive is uncompressed. In order to uncompress a file, a user needs to either use the same program used to compress the file, or use another program that is compatible with the particular compression format. That meant that users were required to use standalone programs to compress and uncompress their files. The same problem occurs when trying to work with and manipulate compressed archived files. For example, a user wanting to open an existing compressed file, modify the file, or extract data from the file and transfer it to another file would have to command a standalone program to uncompress the original file and command the standalone program to compress the modified file. This process is often burdensome and inconvenient to the user. Therefore, it would be beneficial to create a product that would eliminate the need for separate standalone compression programs, and eliminate the need to separately command a file to be uncompressed or compressed each time the file is opened, modified, or saved.

Such products have been developed by many companies, including products used in a Microsoft Windows Explorer environment. Microsoft Windows Explorer is a browser program in Windows for exploring directories, files, and folders in a computer system. In connection with Windows Explorer, Microsoft provides a shell name space extension application program interface (API) for software developers to use to integrate other software utility programs into Windows Explorer. Several companies have developed compression file manipulation programs using the Microsoft Windows Explorer interface. Some of these products include: ArjFolder by Raphael Mounier; Cab Viewer by Microsoft Corporation; CleverZip by Cleverness, Inc.; Zip Explorer Pro by Aeco Systems; Internet Neighborhood by KnoWare, Inc.; Net Explore; ZipMagic by Mijenix Corporation; and Netzip Classic by Netzip Inc. The Internet Neighborhood and Net Explore products are file transfer protocol (FTP) products which integrate FTP sites into Windows Explorer. ZipMagic and Netzip Classic are device driver products.

ZipMagic, patented under U.S. Pat. No. 5,907,703, is directed to a device driver for accessing computer files. The ZipMagic patent utilizes a device driver implemented in the operating system of Windows Explorer that makes all zip files appear to be folders.

However, all of the above products are implemented differently from the present invention, and do not include many of the features of the present invention. Many of the above programs have increased performance overhead in processing (compressing/uncompressing) files continuously in and out, and it is often difficult for a user to determine if he is in a zip file or rather in a folder.

Accordingly, there is a need for a system and method for easy management and manipulation of archive files. The program of the present invention is intended for use on Microsoft Windows 9x, Me (Millennium Edition), NT 4.0, and 2000 systems. Windows 95 and NT 4.0 systems require Microsoft Internet Explorer 4.0 or greater.

BRIEF SUMMARY OF THE INVENTION

The present invention provides a software utility program that is seamlessly integrated into Microsoft Windows Explorer. The program allows users to manage and manipulate their zip archive files without leaving the Explorer environment. Users may open, archive, compress, extract, create, modify and add to their zip archive files using Windows Explorer's context and pull-down menus, toolbars, copy and paste operators, and drag and drop operators. A mail compressor attachment module integrates into Microsoft Outlook to automatically archive files sent via email. An Internet plug-in module works with Internet Explorer 4.0+ or Netscape Communicator 4.0+ to facilitate the handling of downloaded zip files from the Internet. The Internet module allows a user to view and manipulate zip archive files downloaded from the Internet.

An archive manager provides quick access to a user's zip files stored on the computer. The archive manager can create a hierarchical tree representation of a zip file which allows quick and easy management and manipulation of complex zip archives. Shortcuts may also be optionally created and/or deleted by the archive manager. Double-clicking a shortcut will open a zip file under the archive manager. File shortcuts may be created using copy and paste operators, dragging a file into the archive manager, or via the scan and add function. File shortcuts are deleted by highlighting the shortcut and selecting delete on the keyboard or Windows Explorer menu. Shortcuts may be created that branch to a zip file's contents under a specified working directory as an alternative to working within the archive manager. Archive files may be extensively modified before the actual changes are saved. As a result, system overhead is minimized, as the resources required for such operations are only needed when the archive is actually saved. An edit mode of the archive manager during archive modification illustrates graphic instruction cue icons (indicating Add and Delete states) in the far left column of the Explorer Window.

In addition to easily opening, extracting, creating and modifying archive files, the present invention also includes several miscellaneous features or functions selectable by the user. These functions include edit-before-saving, digital certificate based file authentication and encryption, selecting compression methods by file type and spanning/splitting of archive files.

In one aspect of the invention, an edit-before-saving function that is useful during creating, opening, modifying or extracting an archive file. The edit-before-saving function provides graphic instruction cue icons (indicating Add and Delete states) next to archives that have been modified. Archives may be extensively modified before the actual changes are saved. As a result, system overhead is minimized, as the resources required for compressing and uncompressing are used only when the archives are actually saved.

In another aspect of the invention, a Public Key Infrastructure (PKI) based digital signature, file authentication and encryption function adds a layer of authenticity to the zip archive files. The invention includes a X.509 based authentication and encryption function which allows a user to digitally sign and encrypt individual files archived in a zip file and subsequently authenticate and decrypt those files upon extraction. Digitally signing a zip file allows one to detect whether the integrity of a zip file has been compromised. Encrypting a file denies access to the file's contents by unauthorized users. The ability to store a PKI based digital signature using standard X.509 based certificate (e.g., VeriSign Digital ID) information is a significant enhancement to the zip archive file format. This function allows users to digitally sign an archive file and its contents using a standard X.509 based digital certificate.

This function also allows a user to digitally sign the central directory of the zip file and to encrypt file names and supplemental information such as, but not limited to, file system security descriptor information.

In a further aspect of the invention, a user may select a compression method based on the type of file being saved. The compression methods include Store, Deflate, and DCL Implode. By default, the present invention compresses all files using the Deflate algorithm. A user may choose to compress all files using the Deflate algorithm, or may optionally modify the default method of compression, as well as the method to be used on a specified file type. In addition, a user may specify to use the 64k dictionary version of the Deflate algorithm for improved compression.

The spanning function of the invention allows a user to span large zip archives over multiple removable media diskettes. The splitting function of the invention allows a user to divide an archive file into specified file segment sizes.

Various other features, objects, and advantages of the invention will be made apparent to those skilled in the art from the following detailed description and accompanying drawings.

BRIEF DESCRIPTION OF SEVERAL VIEWS OF THE DRAWINGS

FIG. 6b displays a table of menu items used in the present invention;

FIG. 7 displays an extract dialog screen of the present invention;

DETAILED DESCRIPTION OF THE INVENTION

Figure 1:
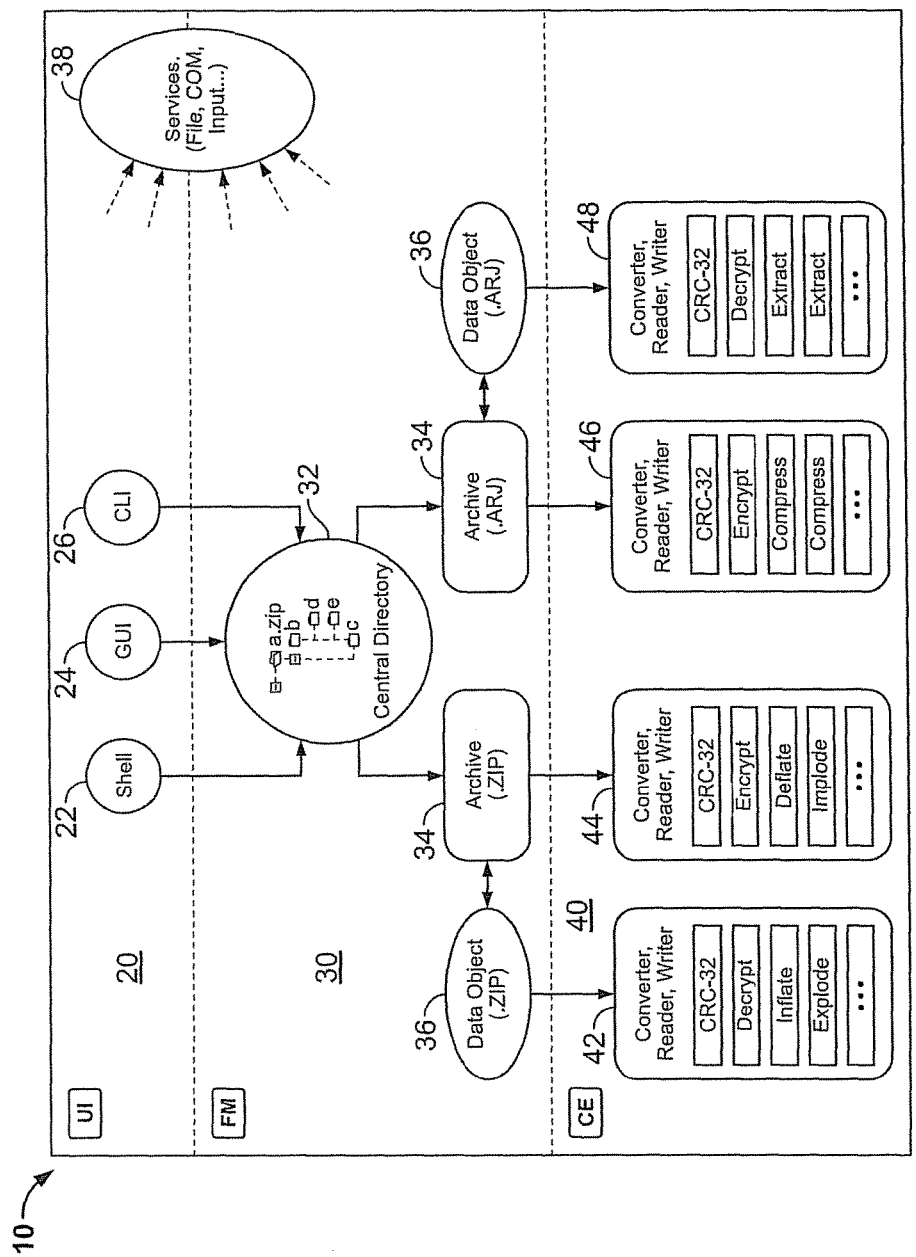
FIG. 1 is a diagram illustrating the software components underlying the system of the present invention.

FIG. 1 is a diagram illustrating the software components underlying the system 10 of the present invention. There are three basic components of the underlying software. These components are the user interface (UI) 20, the file management (FM) component 30, and the compression/extraction engine (CE) 40.

The lowest level component is the compression/extraction engine 40. The compression/extraction component 40 consists of the actual compression, extraction, and crc-32 algorithms. These are written as a set of portable C language routines, with higher level C++ routines interfacing with the higher level file management component 30. The file management component 30 consists of the central directory 32 which holds a cached tree-like structure of the archive independent of the actual archive type. Actual archive implementation is used by the central directory 22 to read/write data to the archives 34 and the user interface 20. The central directory 32 consists of folder objects and file objects 36. A services object 38 is also part of the file management component 30. The services object 38 acts as a helper interface between the user interface component 20 and the file management component 30. The user interface 20 consists of a shell 22, a graphical user interface (GUI) 24, and a call level interface (CLI) 26.

The data object 36 supports one or more standard file formats (Explorer or File Manager drag and drop), and one or more custom formats (zip compressed non-encrypted and zip compressed). When files are dropped from Explorer to the archive, the archive requests available standard data formats to compress the data. When files are dropped from archive to Explorer, Explorer requests available standard data formats. In this instance, the data object will need to uncompress the data. When files are dropped from one zip archive to another zip archive, the target archive will be able to detect the native data and copy it without modification. When files are dropped from an ARJ archive to a zip archive, the zip archive will be able to recognize only standard formats, as a result, the ARJ data object will uncompress the data and the zip archive will compress the data. So it is possible to convert data between different archives.

Figure 2A:
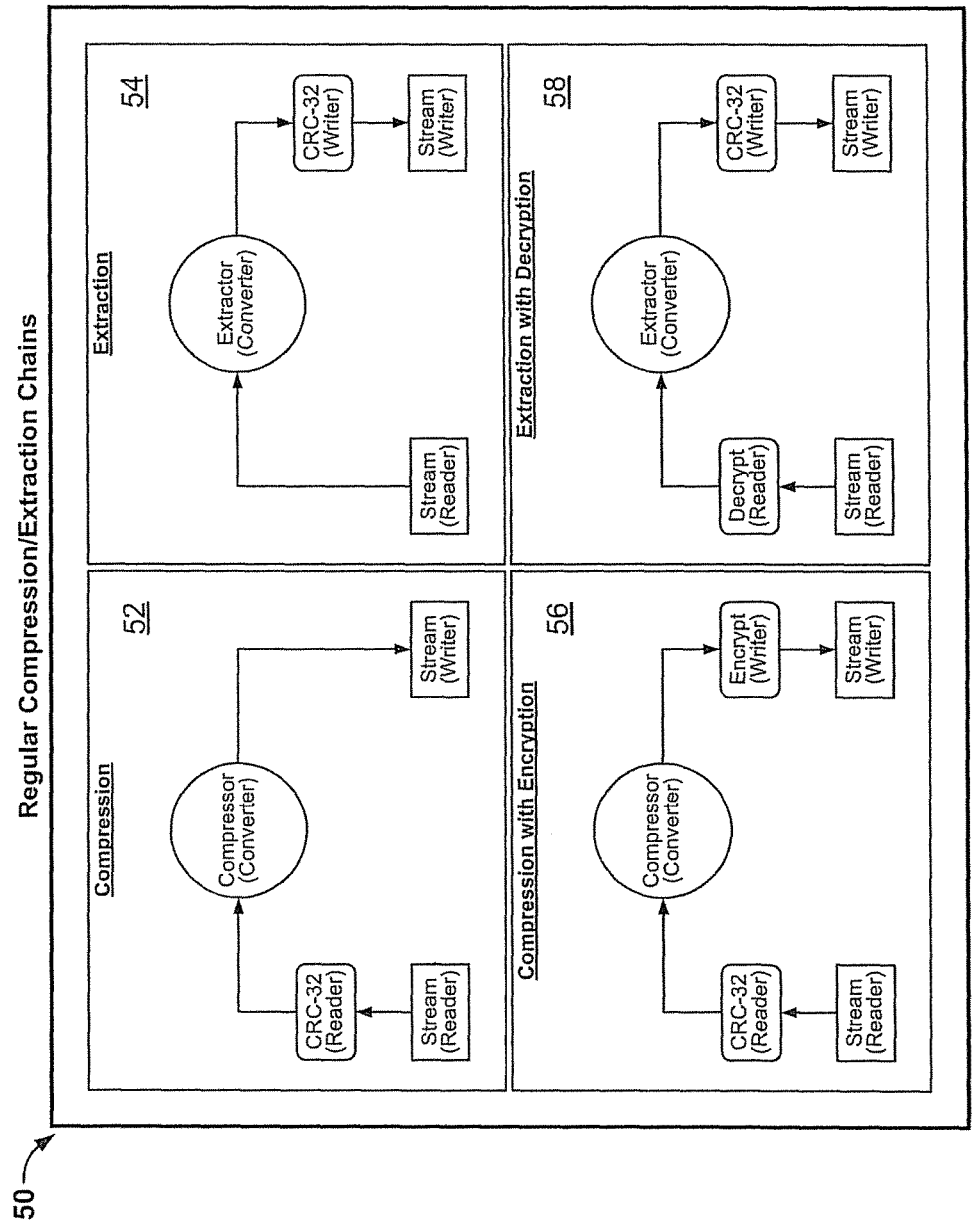
FIGS. 2a-2e are diagrams illustrating the different compression and extraction chains used in the present invention.
Figure 2B:
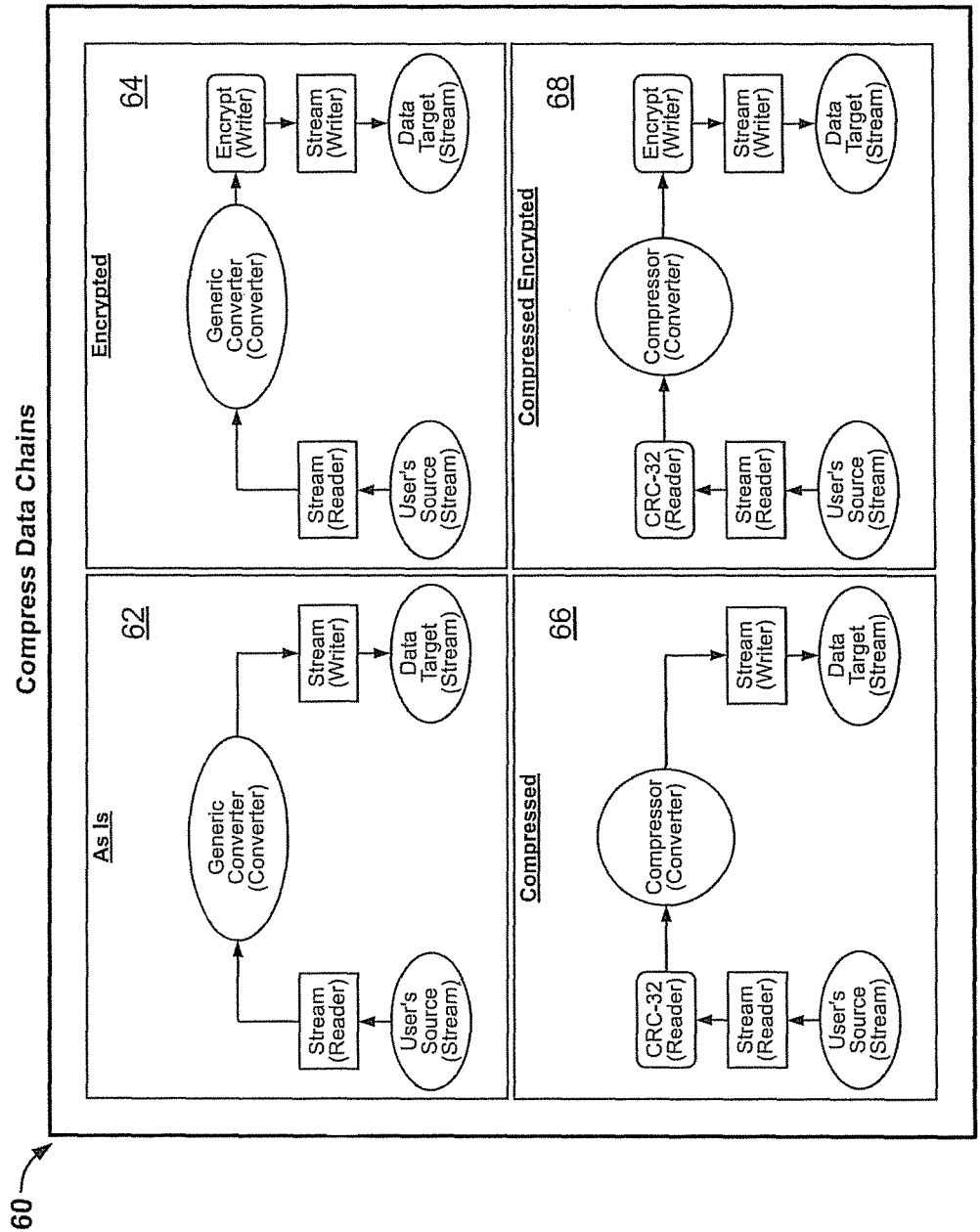
Figure 2C:
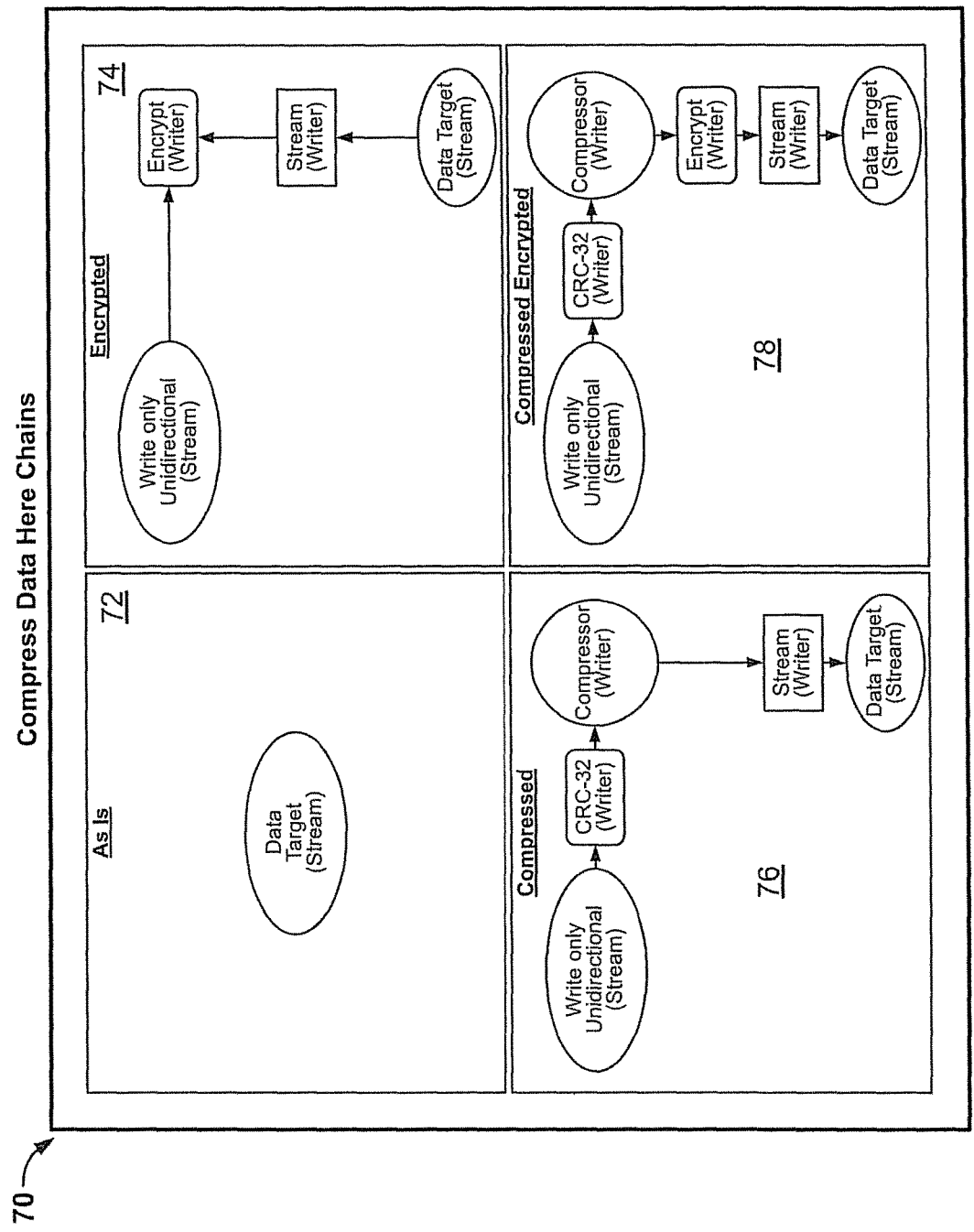
Figure 2D:
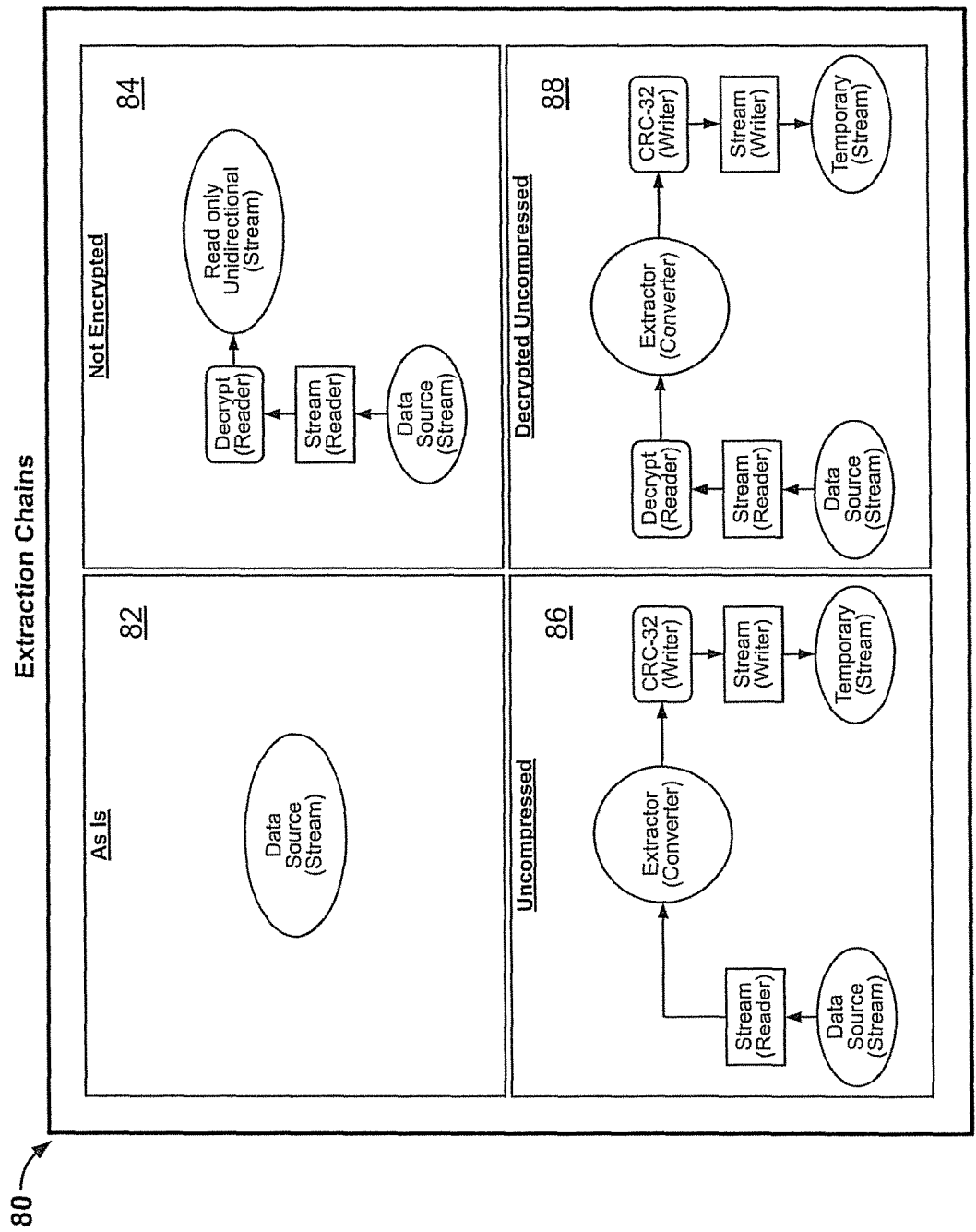
Figure 2E:
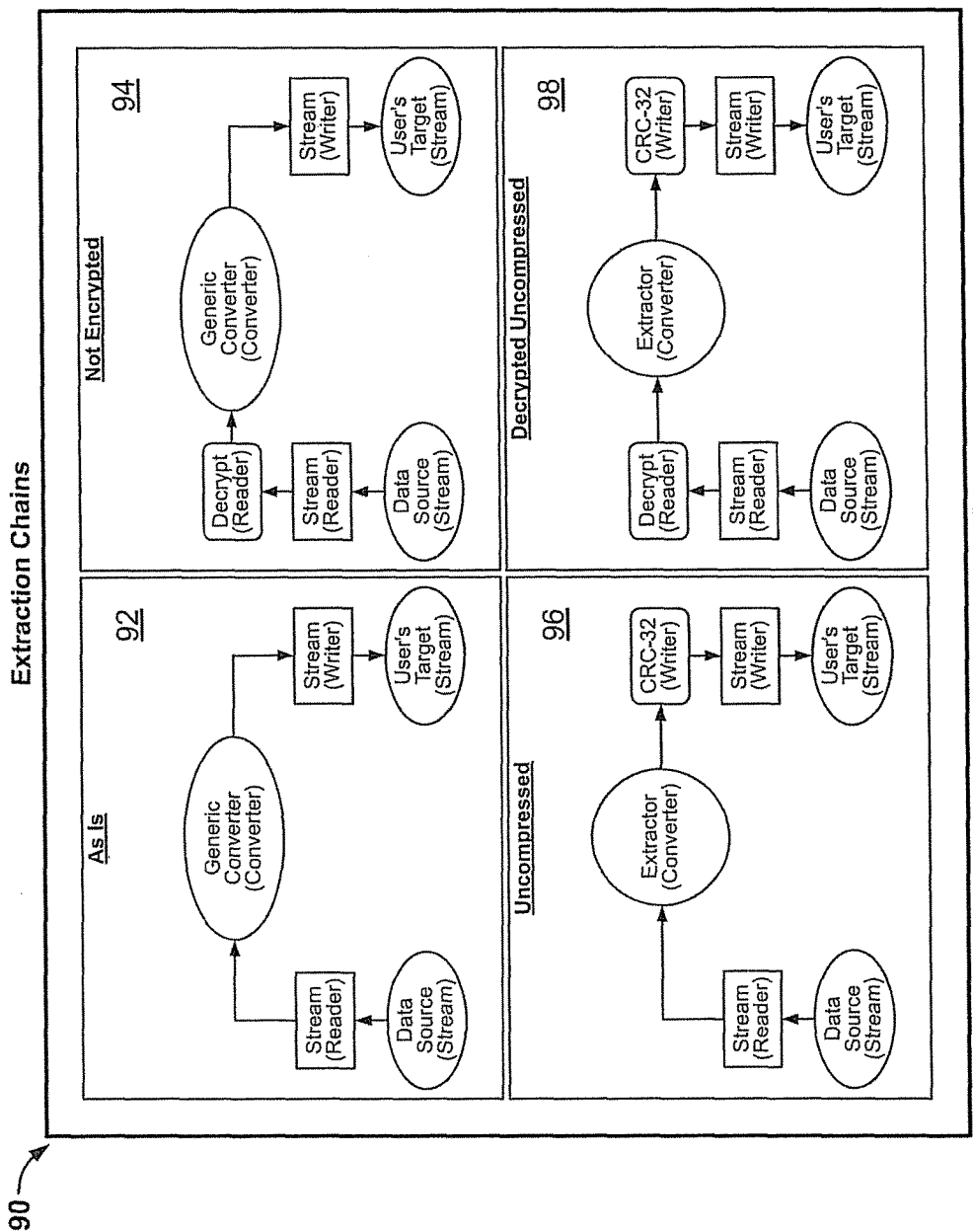

FIGS. 2*a*-2*e* illustrate the different compression and extraction used by the present invention. In FIG. 2*a*, regular compression and extraction chains are shown. In FIG. 2*b*, compression data chains are shown, including the use of a generic converter involving no compression. In FIG. 2*c*, data here compression chains are shown. In FIG. 2*d*, GetData extraction chains are shown. In FIG. 2*e*, GetDataHere extraction chains are shown.

The compression/extraction engine 40 and the file management component 30 form the data compression library that is used to build applications, such as the present invention, needing zip compatible compression and file management.

The present invention provides a software utility program that is integrated into Microsoft Windows Explorer for managing and manipulating archive files without leaving the Explorer environment. The invention includes an archive manager which allows a user to open, view, modify (add/delete), and extract data from an existing archive, or create a new archive using modified Windows Explorer right-click context menus, pull-down menus, toolbars, copy and paste operators, or drag and drop operators.

Figure 3:
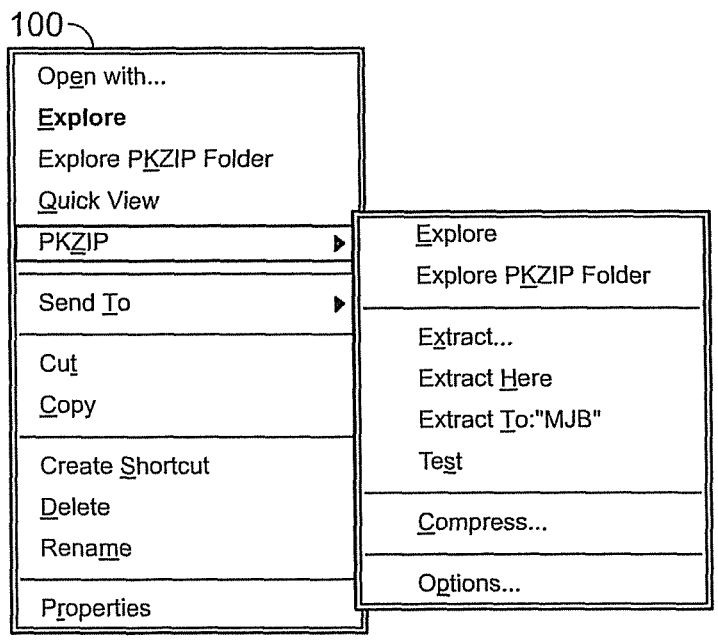
FIG. 3 displays a right-click context menu of the present invention.

FIG. 3 displays a right-click context menu 50 of the present invention which may be used to open, modify and extract files from an exiting zip file, or create a new zip file. In opening a zip file, a user may simply double-click the file to view the contents of the file. Alternatively, the following is an example of the steps one might follow to open and view the contents of a zip file. First, the zip archive to be opened is located by using Windows Explorer. Then, the user right-clicks on the zip file he wants to open. A context menu appears. PKZIP/Explore is selected. The contents of the zip file will be displayed in the right pane under the archive manager. As another alternative, a user may select PKZIP/Explore PKZIP Folder to create a folder shortcut under the current folder, and display the contents of the zip file via this folder.

Figure 4:
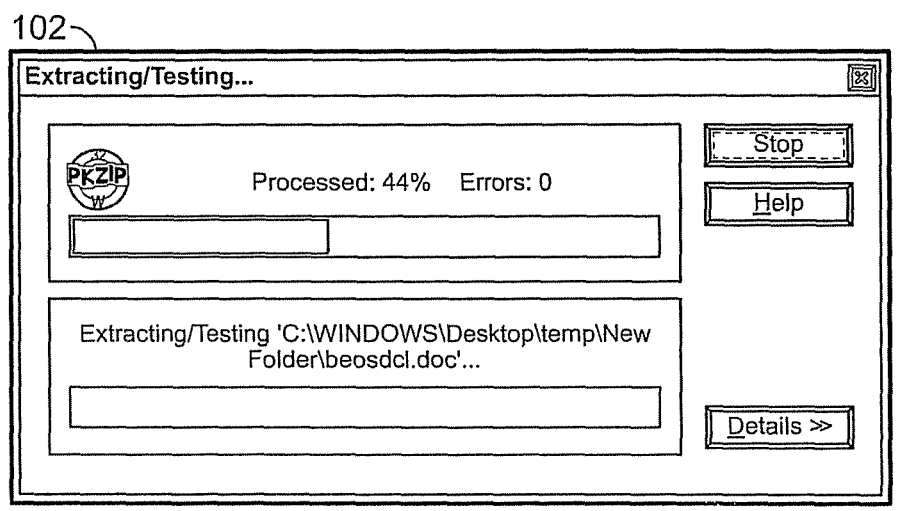
FIG. 4 displays a progress dialog screen of the present invention.
Figure 9:
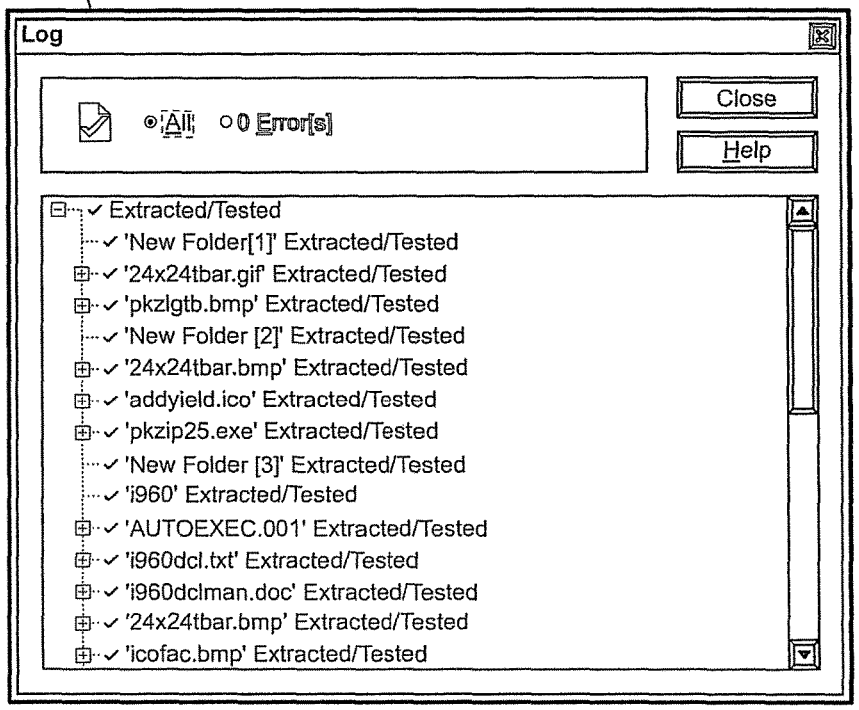
FIG. 9 displays a log dialog screen of the present invention.
Figure 10A:
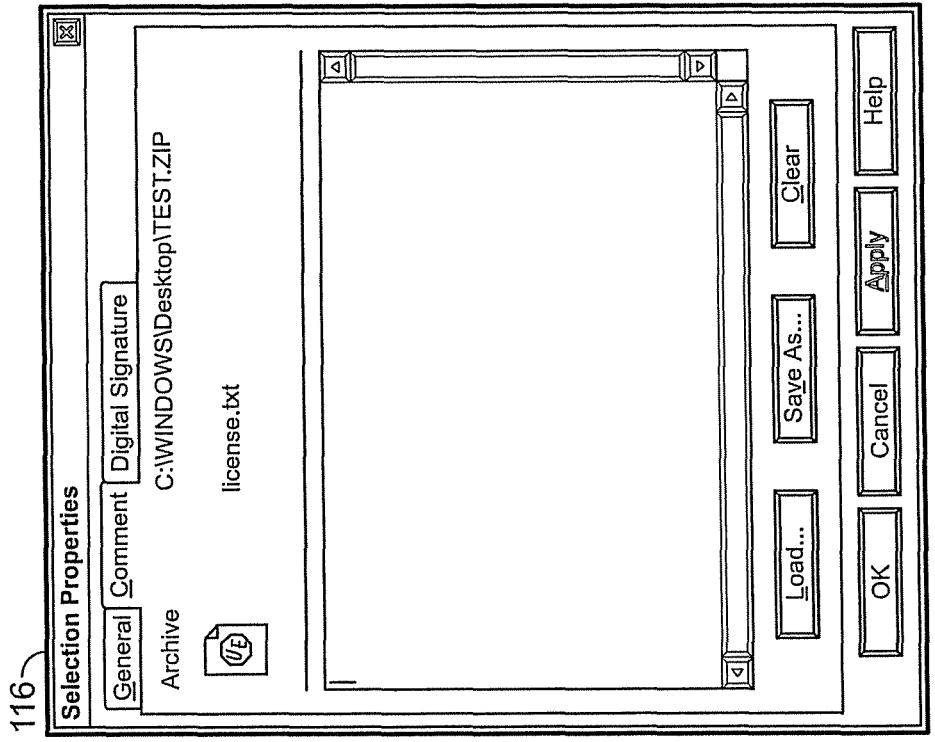
FIG. 10A displays a "General" screen of a series of selection properties dialog screens of the present invention.
Figure 10B:
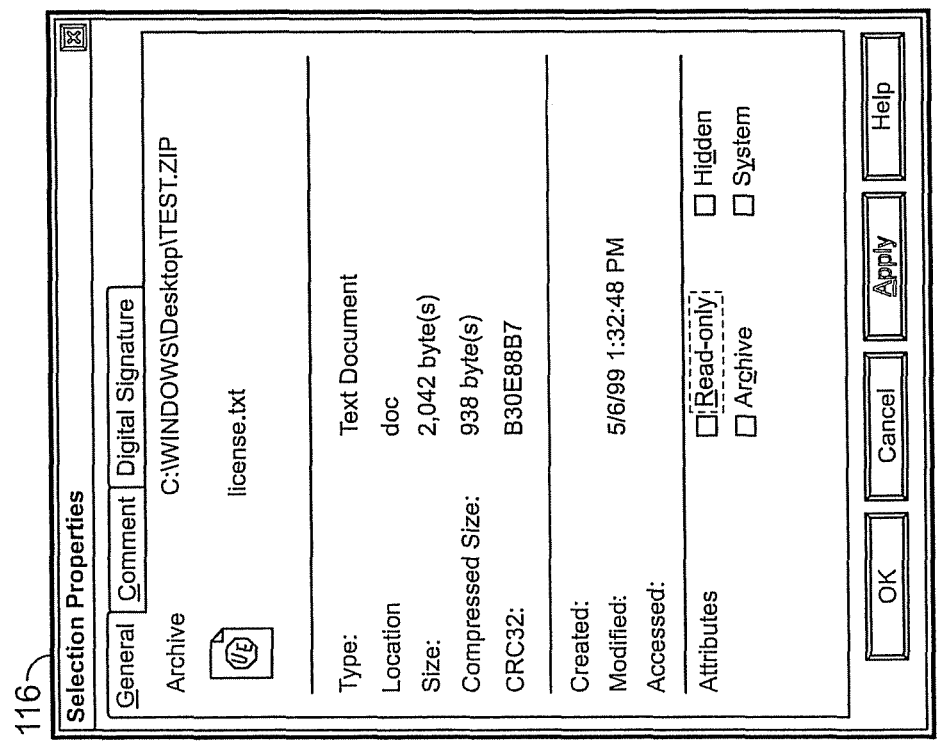
FIG. 10B displays a "Comment" screen of a series of selection properties dialog screens of the present invention.
Figure 11A:
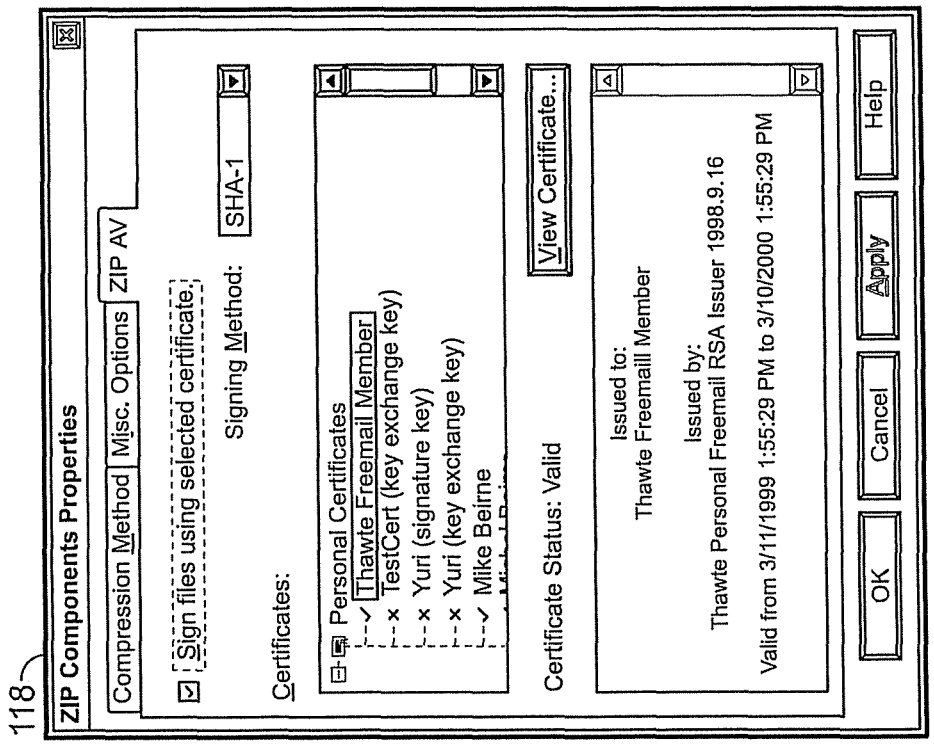
FIG. 11A displays a "General" screen of a series of authenticity/certificate dialog screens of the present invention.
Figure 10C:
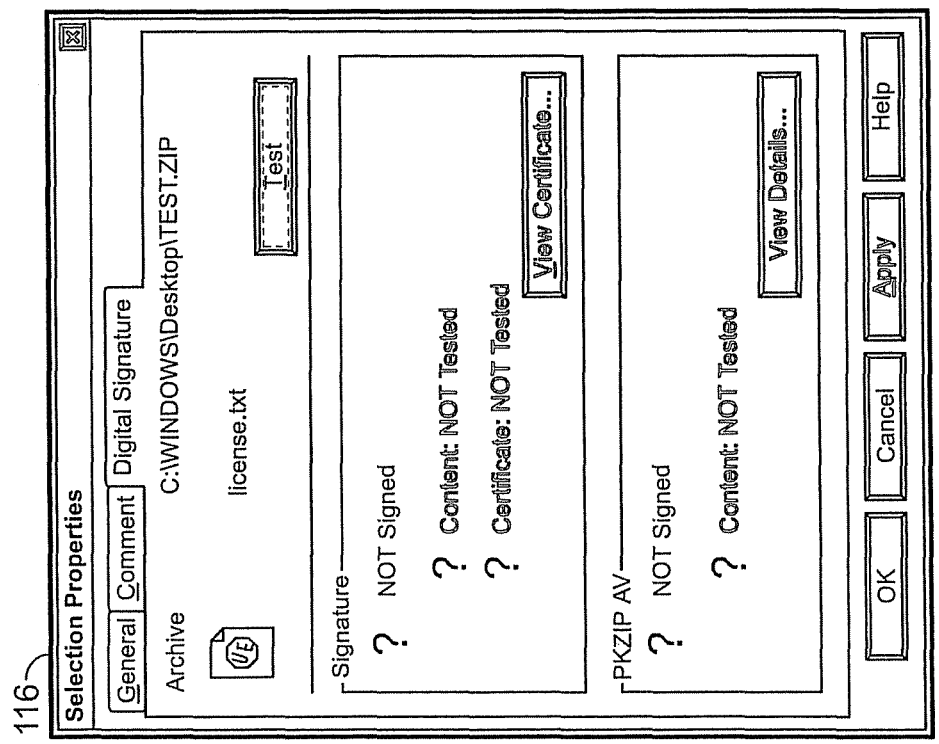
FIG. 10C displays a "Digital Signature" screen of a series of selection properties dialog screens of the present invention.
Figure 11C:
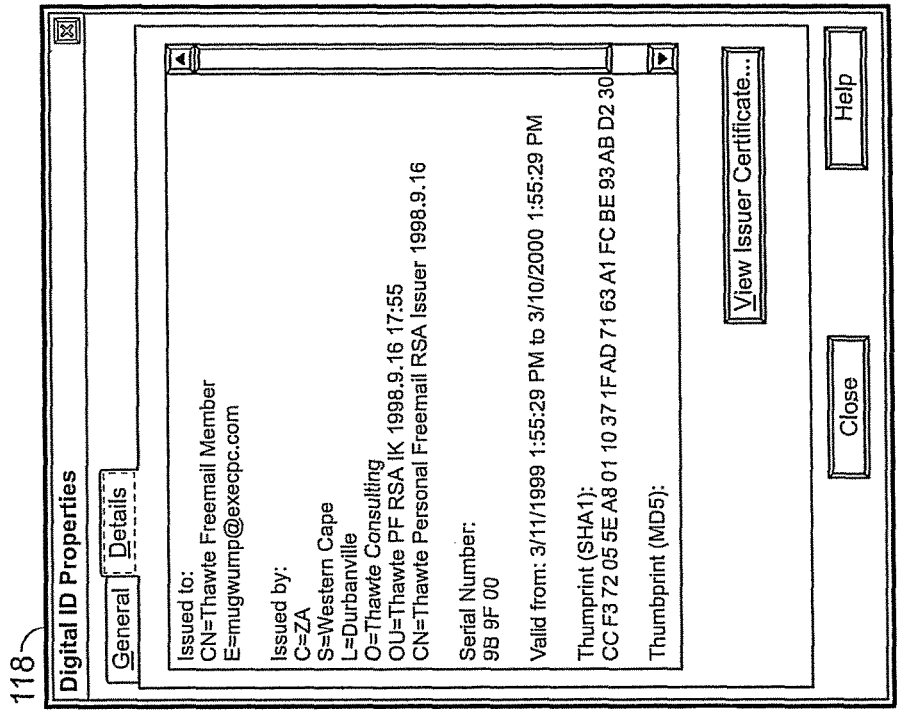
FIG. 11C displays a "Digital Signature" screen of a series of authenticity/certificate dialog screens of the present invention.
Figure 11B:
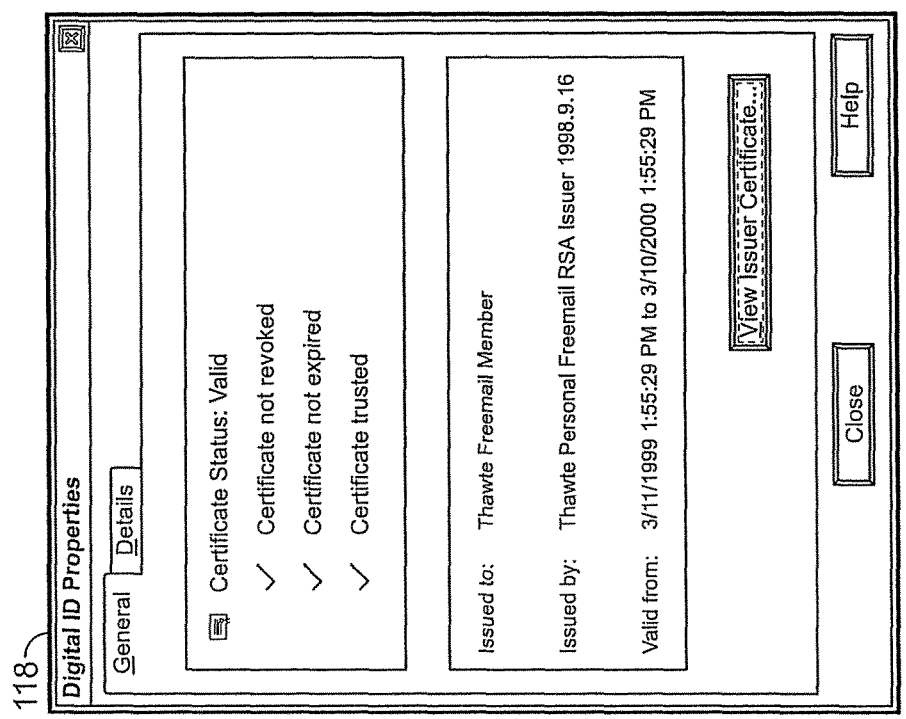
FIG. 11B displays a "Comment" screen of a series of authenticity/certificate dialog screens of the present invention.

To extract individual files and/or folders archived in a zip file, a user opens the zip file in Explorer as discussed above and invokes the extract dialog, by selecting the Extract menu item in the right-click context menu. The Extract dialog appears, FIG. 7, allowing the user to manually specify a destination directory. Alternatively, a user may select PKZIP/Extract Here to extract the contents of the archive into the directory where the zip archive resides. To create a directory (e.g., "Test") under the directory where the zip archive resides, and extract all files in that directory, the user selects the "Extract-to" menu item. Alternatively, files may be extracted using a drag and drop operation. The user highlights the files and/or folders he wishes to extract, drags the files to a destination, and drops the files in the enabled destination. The files and/or folders will be automatically extracted into the drop destination. As the extraction process proceeds, the progress is displayed in a progress dialog, as shown in FIG. 4. If there is an error encountered during the extraction process, the error is indicated in the progress dialog and a log dialog, shown in FIG. 9.

Figure 5:
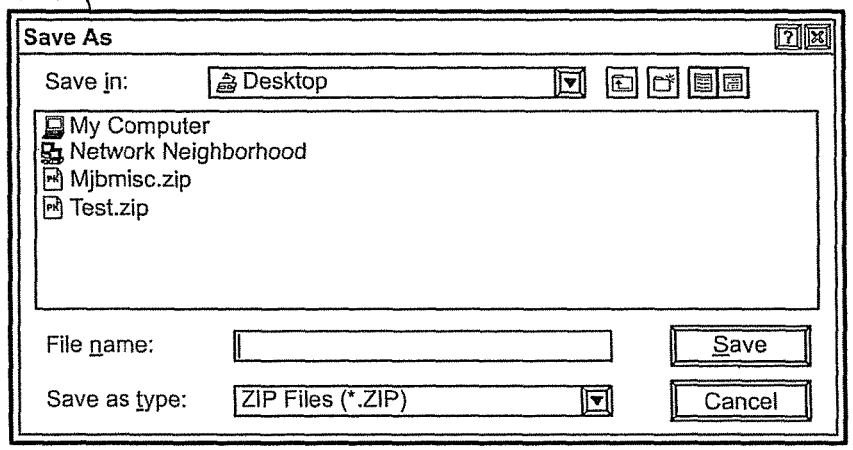
FIG. 5 displays a save as dialog screen of the present invention.

The present invention also allows a user to create a new zip file. The following is an example of the steps one might follow to create a new zip file. First, the user highlights the files and/or folders he wishes to archive. The user then clicks his right mouse button to bring up the context menu. PKZIP/Compress is then selected. The "Save as" dialog appears, FIG. 5. A name and destination are specified for the zip file, and the save button is clicked to proceed. The progress dialog appears to monitor completion and to indicate errors in the process. The new zip file should now reside in the specified destination directory. A user may alternatively create a new zip file by other means as well. A user may create a new folder in an archive by selecting the New Folder menu toolbar item and specifying a folder name as desired.

Adding or deleting files in a zip file works somewhat differently than these same operations do in Explorer. For example, in Explorer, when a user highlights a file and clicks the delete key, that file is immediately deleted. The present invention includes an edit-before-saving function, so that when a user highlights a file and clicks the delete key, a graphic instruction cue icon is displayed directly to the left of the file icon, indicating that this file is to be deleted. Similarly, when a file is added to an archive, the program will display an add icon directly to the left of the file icon indicating that this file is to be added. In other words, a zip file is not actually modified until the user specifically instructs the program to save the zip file.

The following is an example of the steps one might follow to modify an existing zip file. A user first locates and opens the zip file he wishes to modify. Next, the files and/or folders to add to the archive are specified by clicking the add toolbar button, thereby invoking the add dialog, or by dragging the files and/or folders from their source and dropping them at a destination. A user may alternately use the copy and past operation to specify files and/or folders to add to the archive. The program will display an add icon (such as plus symbol) indicating that these files and/or folders are to be added when the archive is saved.

In a similar manner, a user may specify files and/or folders to delete in the archive by highlighting the files the user wishes to delete, and clicking the delete key, or by selecting the Delete menu item. The program will display a Delete icon (such as a circle with a slash through it) indicating that these files and/or folders are to be deleted when the archive is saved.

After the user is finished modifying the zip file, the file may be saved by selecting the Save menu item available under the File menu, or by use of the right-click context menu. A user may also click the Save button on the toolbar. To save the modifications to another zip file, select the Save As or Save Copy As menu items.

Figure 6A:
FIG. 6a displays a table of toolbar buttons used in the present invention.
Figure 8:
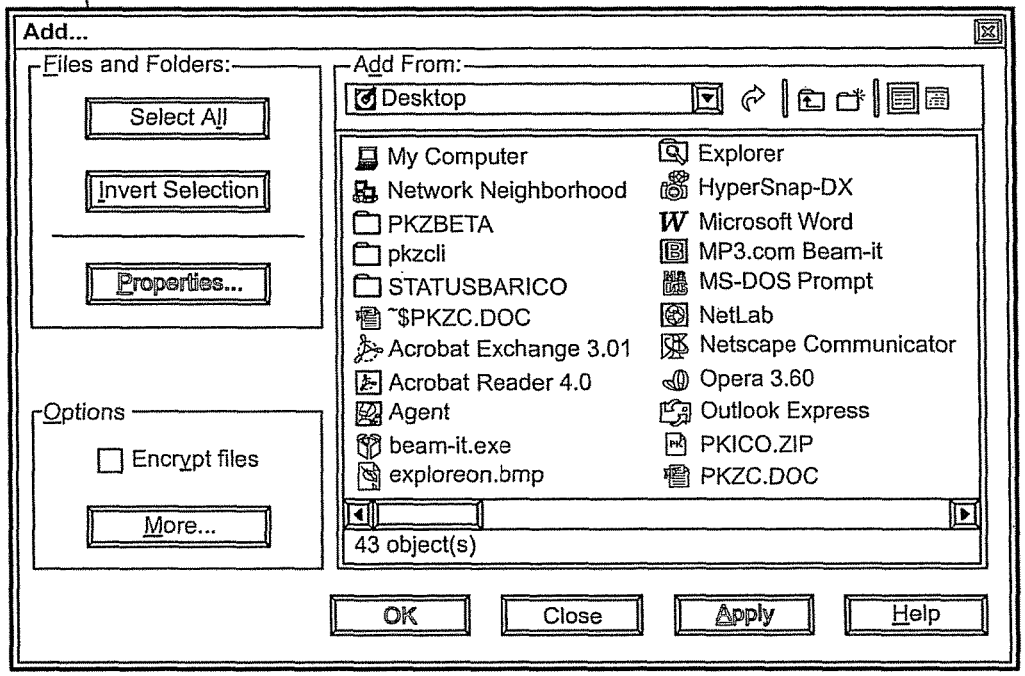
FIG. 8 displays an add dialog screen of the present invention.

FIGS. 6a and 6b display modifications and additions to the Explorer toolbar buttons and menu items used in the present invention.

The present invention may also include many options which may be configured in the options tab dialog accessible via the menu/tool bar or via the right-click context menu. One option is the compression method. Under this option, a user may specify a compression algorithm other than the default algorithm. The compression algorithms to choose from may include Store, DCL Implode, and Deflate. By default, all files are compressed using the Deflate algorithm. As one example, a user may wish to use the Store feature for all JPEG files, since the compression ratios on files of this type are typically negligible. A user may specify a default method or extension specific method under the extension column. Depending on the compression method specified, a user may wish to configure one or more of the storage parameters, as described below.

There are no available settings for the store method. The program simply archives the specified files without compression. Since the program does not expend time compressing files, this is the fastest method of archival.

Under the DCL Implode method of compression, the dictionary byte size (i.e., 1024, 2048, 4096) a user wishes to use when compressing files is configurable along with the data type. The binary setting should be selected to optimize compression of program files or other non-text files. The ASCII setting should be selected to optimize compression of text files.

Most zip utilities use the Deflate algorithm to compress files. Under this algorithm, the compression level may be set using a slide bar to specify the level of compression you wish to apply when archiving files. Moving the slide bar all the way left instructs the program to use the fastest method of compression. Moving the slide bar right increases the time the program expends compressing the file which, as a result, improves compression. Moving the slide bar all the way right instructs the program to apply maximum compression to files. This is the slowest method of file archival because the program must expend time maximizing compression on the files. Typically, applying maximum compression results in the smallest zip file.

In addition, the dictionary kilobyte size may be selected when using the Deflate algorithm. The dictionary size is selectable between a 32K dictionary and a 64K dictionary. The 64K dictionary provides slightly better compression ratios, but may not be compatible with all zip utilities.

The present invention also allows the user to digitally sign and encrypt the individual files archived in a zip file as well as the central end directory, and subsequently to authenticate and decrypt those files upon extraction. The signing and encrypting functionality is based on PKCS No. 7, and related public key encryption standards and is therefore compatible with security functionality in other applications such as Microsoft's Internet Explorer. Signing a zip file allows one to detect whether a zip file's integrity has been compromised. Encrypting a file denies access to the file's contents by unauthorized users.

Before a user can sign or encrypt files, he must first have a digital certificate with which to sign or encrypt. A digital certificate may be obtained from VeriSign or Thawte or from another certificate authority.

The present invention also provides a software utility program that integrates the compression/extraction engine into Microsoft Outlook to compress, encrypt and authenticate email attachments without leaving the Outlook environment. The invention includes a toolbar button and a tooltray menu that allows turning the compression of email attachments on or off. The compression of email attachments reduces the storage and transfer time of email messages and can reduce the spread of common email attachment viruses.

The system of the present invention may further include a more generally applicable mail attachment compressor module. Most email programs support sending file attachments along with the main body of the email message. Most users can choose to send the attached file as it originally exists, or compress it prior to attachment to the mail message so it is smaller and more efficient to send and store. Currently, the file to be attached must be manually compressed outside the email program and then attached using the attachment features of the email program. The mail attachment compressor module of the present invention integrates compression into the standard Microsoft Outlook mail message edit form so compressing attachments can be done automatically as the message is sent. The mail attachment compressor module also provides the ability to digitally sign attachments as they are sent for greater security.

After installing the program of the present invention, the mail form of Microsoft Outlook will have two additional buttons in its "standard" toolbar. These buttons include a Toggle Compression button and an Options button. If the Toggle Compression button is not depressed (the default state), all mail attachments will be compressed automatically when the standard "send" button is used to send the message. Attachments already compressed when attached will be left as is, while attachments that are not compressed will be compressed into a single .ZIP file that will replace the original uncompressed attachments. When the Toggle Compression button is depressed, the compression will not be done and the files will be sent as attached. The Options button will display the Options configuration dialogs from the compression/extraction engine so that the compression actions can be configured. The primary use of this button is to configure digital certificates, but any configurable parameters supported by the compression/extraction engine can be set. These parameters include digital certificates, passwords and compression method options.

Operation of the mail attachment compressor program is initiated by installing the mail attachment compressor module software onto the users system, and initiating Microsoft Outlook. If the mail attachment compression feature is enabled through the toggle button, the attachments will automatically be compressed when the message is sent using the send button. If the mail attachment compression feature is not enabled, then the attachments will be sent unaltered.

The components of the mail attachment compressor module provide the functionality to be implemented within Microsoft Outlook and provide integration between this module and the underlying compression/extraction engine. When compressing an attachment, the files to be compressed will be passed off to the compression/extraction engine of the underlying software program. After compression, the compressed file will be reattached to the original message, the original copies of the attachments that are now compressed will be removed from the message, and any temporary files created during compression will be deleted.

The mail attachments module uses the compression/extraction engine to hook directly into Microsoft Outlook to allow users to compress email attachments into zip files. This module provides an automation hook so that email attachments appended to Outlook mail messages can be automatically compressed when the message is sent.

The Scan and Add dialog of the archive manager is invoked via the Scan and Add toolbar button or the Explorer File/right-click menu. Once the user is finished specifying files to add to the archive manager list, the user clicks OK to add the selected file shortcuts to his list and return to Explorer, or he clicks Apply to add the selected files and remain in the Scan and Add dialog. The options available via this dialog include Files and Folders, multiple selection scan, and Scan and Add form. The archive manager allows the user to add unopened archives to the archive manager list, and to add multiple files using the multiple selection scan option under the archive manager.

While the invention has been described with reference to preferred embodiments, those skilled in the art will appreciate that certain substitutions, alterations and omissions may be made without departing from the spirit of the invention. Accordingly, the foregoing description is meant to be exemplary only, and should not limit the scope of the invention set forth in the following claims.

The invention claimed is:

1. A method of encrypting a file on a computer, said method including:
   receiving an electronic file at an application on a computer,
      wherein said application provides a graphical user interface including an optionally user-selectable setting to enable encryption of electronic data,
      wherein, when said user-selectable setting is actuated using said graphical user interface, said application performs the steps of:
         receiving a public key;
         encrypting said electronic file to form a public key encrypted electronic file using said public key;
         placing said encrypted electronic file in an electronic container file; and
         placing encryption information relating to said public key encrypted electronic file inside said electronic container file,
      wherein said electronic container file has been enhanced to allow encryption information relating to said public key encrypted electronic file to be placed inside said electronic container file.

2. The method of claim 1 further including:
   compressing said electronic file before encrypting said file.

3. The method of claim 2 wherein said compressing employs a .zip-type compression algorithm.

4. The method of claim 2 wherein said compressing employs a Deflate-type compression algorithm.

5. The method of claim 1 wherein said electronic file is not compressed before encrypting.

6. The method of claim 1 wherein said electronic file includes a file characteristic, said method further including:
   encrypting said file characteristic to form an encrypted file characteristic; and
   placing said encrypted file characteristic in said public key encrypted electronic file.

7. The method of claim 6 wherein said file characteristic includes the name of said electronic file.

8. The method of claim 1 further including:
   digitally signing said public key encrypted electronic file using a digital signature.

9. The method of claim 8 wherein said digital signature is a PKI based digital signature.

10. The method of claim 8 wherein said digital signature uses an X.509 based certificate.

* * * * *